219-121

INVENTORS D. G. CRUICKSHANK
J. P. EPPERSON
W. A. MURRAY, JR.
R. A. WYDRO, SR.

BY W. L. Williamson
ATTORNEY

United States Patent Office 3,534,462
Patented Oct. 20, 1970

3,534,462
SIMULTANEOUS MULTIPLE LEAD BONDING
David Graham Cruickshank, Pennington, N.J., James Philbert Epperson, Winston-Salem, N.C., and William Alexander Murray, Sr., and Richard Allen Wydro, Sr., Trenton, N.J., assignors to Western Electric Company, Incorporated, New York, N.Y., a corporation of New York
Filed Aug. 31, 1967, Ser. No. 664,747
Int. Cl. B23k 31/02
U.S. Cl. 29—471.1 6 Claims

ABSTRACT OF THE DISCLOSURE

The bonding of multiple leads on an individual basis is a tedious, time-consuming operation which is often impractical and uneconomical. For example, in bonding individual leads with a beam of radiant energy such as a laser beam, it is frequently impractical and uneconomical to align the lead with a bonding site, align the bonding site and the lead with the beam of radiant energy, apply the laser beam and then repeat the process for each lead to be bonded. As disclosed herein, a beam of radiant energy is shaped into a predetermined pattern so that the beam can be simultaneously applied to a plurality of leads. A composite cylindrical lens is disclosed, for example, which includes a plurality of cylindrical lens segments wherein a line formed by each segment when a collimated beam of radiant energy strikes the composite lens forms a side of a polygon. A perimeter pattern may be formed in this manner which is suitable for simultaneous multiple lead bonding. For example, in simultaneously bonding a plurality of leads extending from a beam lead-like device, the perimeter pattern may have essentially the same configuration as the device so that radiant energy may be applied simultaneously to the leads to be bonded without applying the radiant energy directly to the device itself.

BACKGROUND OF THE INVENTION

A two-material approach to integrated circuits permits the mass manufacture of integrated circuits having the high quality required for communication systems, see 1966 October/November issue of the Bell Telephone Record. For example, high quality active components such as transistors and diodes may be manufactured employing the semiconductor technology and high quality passive components such as resistors and capacitors may be manufactured employing the thin-film manufacturing technology. However, it is essential that such semiconductor circuits be reliably interconnected with associated thin-film circuits to produce composite integrated circuits having the high quality required for use in communcatiion systems. An additional, very practical requirement is that such interconnections be made economically.

Radiant energy bonding such as laser bonding may be employed to make interconnections on an individual basis with the required reliability. However, if each interconnection is made individually, lead bonding becomes a tedious, time-consuming operation and hence, often most uneconomical It is, therefore, an object of this invention to provide a method for economically making multiple interconnections.

An additional object of this invention is to provide a method for shaping a beam of radiant energy into a desired pattern.

Another object of this invention is to provide a method for shaping a beam of radiant energy into a perimeter pattern.

Still another object of this invention is to provide a method for shaping a beam of radiant energy in a line or lines which define a perimeter of a geometric figure such as a circle or a polygon.

Yet another object of this invention is to provide an apparatus for shaping a beam of energy to simultaneously apply the radiant energy to a plurality of leads extending from a workpiece.

Another object of this invention is to provide an apparatus for accomplishing each of the foregoing objects.

SUMMARY OF THE INVENTION

With the foregoing objects and other in view, this invention contemplates a method of shaping a beam of radiant energy into a predetermined pattern including the steps of generating a beam of radiant energy and shaping the beam into one or more lines which define the predetermined pattern.

This invention also contemplates a method of simultaneous multiple lead bonding including the steps of generating a beam of radiant energy, shaping the beam into a predetermined pattern and applying the pattern to a plurality of leads to simultaneously bond the leads.

In addition, this invention contemplates a device for shaping a beam of radiant energy into a predetermined pattern wherein facilities are provided for generating a beam of radiant energy and for shaping the beam into one or more lines which define the predetermined pattern.

Also, this invention contemplates a device for simultaneously bonding multiple leads wherein facilities are provided for generating a beam of radiant energy, shaping the beam into a predetermined pattern and applying the pattern to a plurality of leads to simultaneously bond the leads.

This invention further contemplates a composite cylindrical lens wherein the cylindrical lens is formed by a plurality of cylindrical lens segments held together, with a line formed by each segment when a collimated beam strikes the composite cylindrical lens defining the side of a polygon.

DETAILED DESCRIPTION

Figure 1:
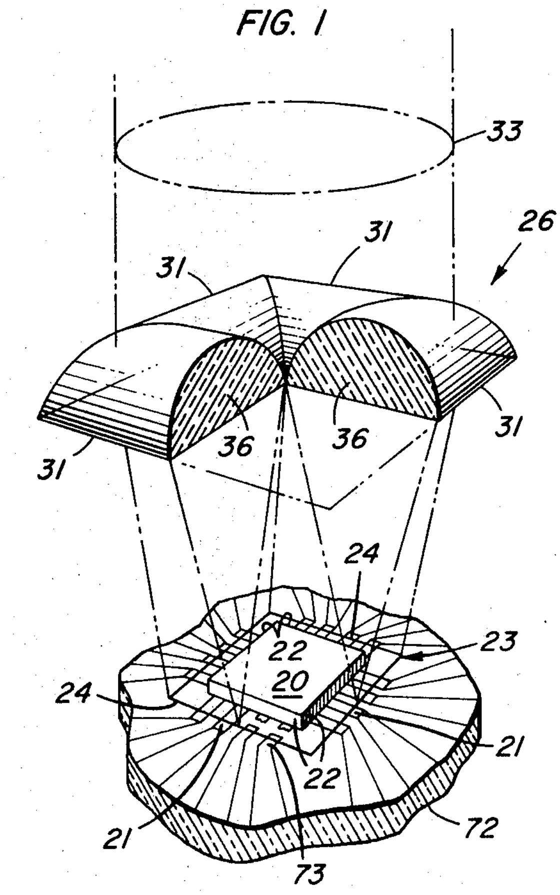
FIGS. 1–4 illustrate composite cylindrical lenses suitable for shaping a beam of radiant energy into a predetermined pattern.

Referring now to FIG. 1, it is not unusual for a workpiece 20 such as a beam lead-like device to have a plurality of leads 21—21 extending from each side 22—22 of the workpiece. In fact, many of these devices have in excess of a hundred leads extending therefrom. As will be appreciated, it is tedious, time consuming and expensive to individually bond each lead 21—21. Accordingly, it is highly desirable to simultaneously bond all of the leads extending from a workpiece so as to eliminate the necessi'y of bonding each lead individually. In addition, in simultaneously bonding multiple leads, it is frequently necessary to focus the radiant energy so as to apply the radiant energy at the energy level required for a reliable bond and/or to restrict the radiant energy from those areas which are deleteriously affected by the application of radiant energy. For example, a focused beam of radiant energy may be essential to achieve a fusion weld and fragile beam lead-like devices may be deleteriously affected by the application of radiant energy directly to the devices themselves.

This invention achieves such simultaneous lead bonding by applying a perimeter pattern 23 of radiant energy to the leads 21—21 to simultaneously bond the leads, without applying radiant energy directly to the workpiece. The pattern 23 may have essentially the same configuration as the perimeter of the workpiece 20 and may be formed by a plurality of lines 24—24 of focused radiant energy where the lines are generally parallel to the sides 22—22 of the workpiece 20 and are spaced a predetermined distance from each side.

Although the pattern 23 is characterized as a perimeter pattern, this is not to imply that the line or lines forming the pattern are necessarily continuous. In some applications, it may be desirable to have a broken or dashed line to restrict the application of radiant energy to preselected areas and in many applications it is not essential that the line or lines forming the pattern close upon themselves or meet at the corners of the pattern. As will be appreciated, in multiple lead bonding it is only necessary that the radiant energy strike each lead to be bonded and that in many instances it will be undesirable for the radiant energy to strike other areas. A perimeter pattern as used herein refers to a pattern formed by one or more lines which generally define the perimeter of a geometric figure such as a circle or a polygon.

Referring now to FIGS. 1–4, according to the invention a composite cylindrical lens 26 may be employed to form the pattern 23 for simultaneously bonding the leads 21—21. A cylindrical lens may more accurately be termed a right, semicylindrical lens. In other words, a cylindrical lens does not have a cylindrical configuration but has the configuration of a half cylinder divided longitudinally where a right section of the half cylinder is a semicircle, i.e., a cross-section taken perpendicularly to the longitudinal axis is a half circle. However, for brevity, such lenses are commonly referred to in the optical arts as cylindrical lenses and a right section of such lenses is frequently referred to as a circular cross-section.

Cylindrical lenses have the characteristic of focusing parallel light rays to a line where the line lies in the focal plane of the lens, is parallel to the longitudinal axis of the lens and is normal to a circular cross-section of the lens. As will be appreciated, a cylindrical lens may be cut into a cylindrical lens segment having any desired configuration and still have the characteristic of focusing parallel light rays to a line.

Figure 2:
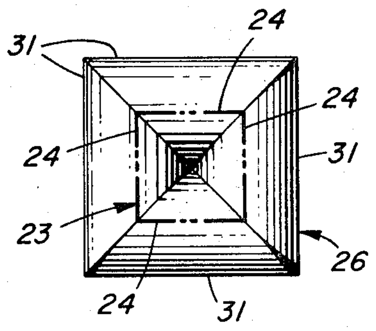

With specific reference to FIGS. 1 and 2, the composite cylindrical lens 26 may be formed, for example, by four substantially identical cylindrical lens segments 31—31 having the configuration of right-angled isosceles triangles where the side opposite the right angle, i.e., the base of the triangle, is perpendicular to a circular cross-section of the segment. The segments 31—31 may be held together to form the composite cylindrical lens 26 with the base of each triangular segment 31—31 forming a side of the composite lens 26. A composite cylindrical lens formed in this manner has a generally square configuration, see FIGS. 1 and 2. Each segment 31—31 of the composite lens 26 will focus parallel rays of a collimated beam 33 of radiant energy to a line perpendicular to a circular cross-section of a segment thereby forming four lines 24—24 of focused radiant energy. As circular cross-sections 36—36 of adjacent segments are perpendicular, the lines 24—24 define two pairs of parallel lines which pairs intersect each other at right angles to form the perimeter of a square.

Figure 3:
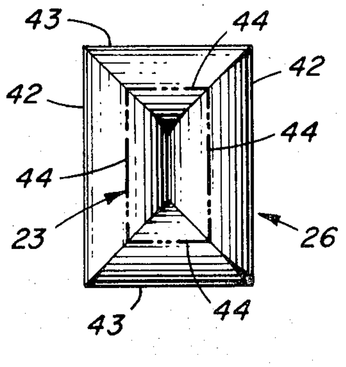
Figure 4:
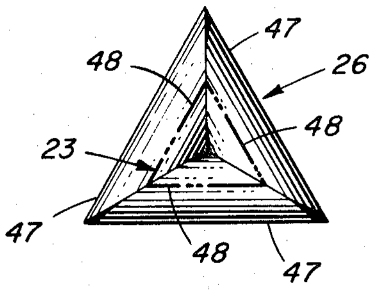

By fitting cylindrical lens segments together in a desired pattern, the composite cylindrical lens 26 may be formed so as to focus the collimated beam 33 into any desired perimeter pattern 23. For example, FIG. 3 illustrates the composite cylindrical lens 26 as having a generally rectangular configuration. By fitting two generally trapezoidal cylindrical segments 42—42 and two generally triangular cylindrical segments 43—43 together to form the composite lens 26 wherein a circular cross-section of segments 42—42 is perpendicular to a circular cross-section of segments 43—43, the composite lens 26 focuses the collimated beam 33 to two pairs of parallel lines 44—44 which intersect at right angles to form the perimeter of a rectangle. FIG. 4 illustrates the composite lens 26 as having a generally triangular configuration. By fitting three generally triangular segments 47—47 together, the collimated beam 33 may be shaped into three lines 48—48 which form the perimeter of a triangle. As even a curved line may be approximated as a series of short straight lines, beam 33 may be shaped by a suitable composite cylindrical lens to form a perimeter pattern suitable for application about the perimeter of a workpiece regardless of whether the perimeter of the workpiece defines a polygon, a curved figure or a combination of the two. In addition, a curved path may be formed by employing a cylindrical lens (not shown) which is shaped so that its longitudinal axis follows the desired path. Such a lens may be formed in any suitable manner such as by well-known molding techniques. Portions of the beam not striking the lens may be masked in any suitable manner to avoid damage to the workpiece.

In this manner, a collimated beam of radiant energy may be shaped so as to follow the perimeter of a workpiece to simultaneously apply radiant energy to leads extending from the workpiece to bond the leads without applying radiant energy directly to the workpiece. In this manner, the beam of radiant energy may be focused at the leads to provide a sufficient energy level to effect a desired bond, for example, a fusion weld and/or the beam of radiant energy may be applied to the leads without directly applying the radiant energy to the workpiece thereby avoiding damage thereto.

Although the cylindrical segments are referred to herein as segments, this is not to imply that they are necessarily cut from a cylindrical lens. Obviously, the segments may be formed by cutting a cylindrical lens into the desired configuration, but the segments may also be originally formed in a desired configuration in the same manner any other lens is formed. The segments may be held together in any suitable manner to form a composite lens as, for example, by cementing the segments together with an optical cement or by mechanically holding the segments together between two cover plates. In addition, the composite lens may be formed by any suitable lens manufacturing technique with the segments integral with each other.

Figure 5:
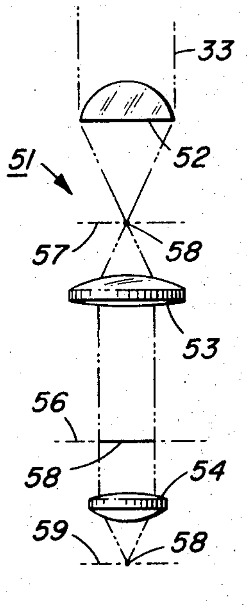
FIGS. 5–7 illustrate an optical system suitable for use with a composite cylindrical lens for adjusting the size of a pattern formed by a composite lens.
Figure 6:
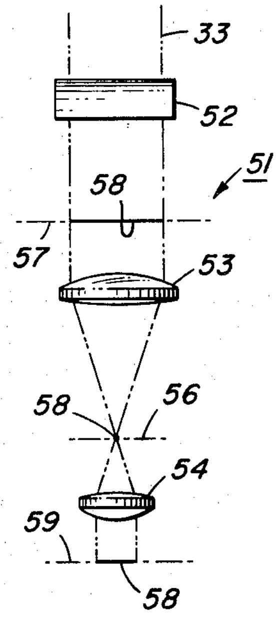

Although the collimated beam 33 may be shaped and applied about the perimeter of a workpiece with only a composite cylindrical lens, it is highly advantageous to employ the composite cylindrical lens in an optical system which permits the size of the perimeter pattern 23 to be adjusted for different workpiece dimensions. FIGS. 5–6 illustrate an optical system 51 suitable for size adjusting the perimeter pattern 23 (FIG. 7) so that the same composite cylindrical lens can be employed to shape the collimated beam 33 for a plurality of workpieces having essentially the same configuration but different dimensions.

Figure 7:
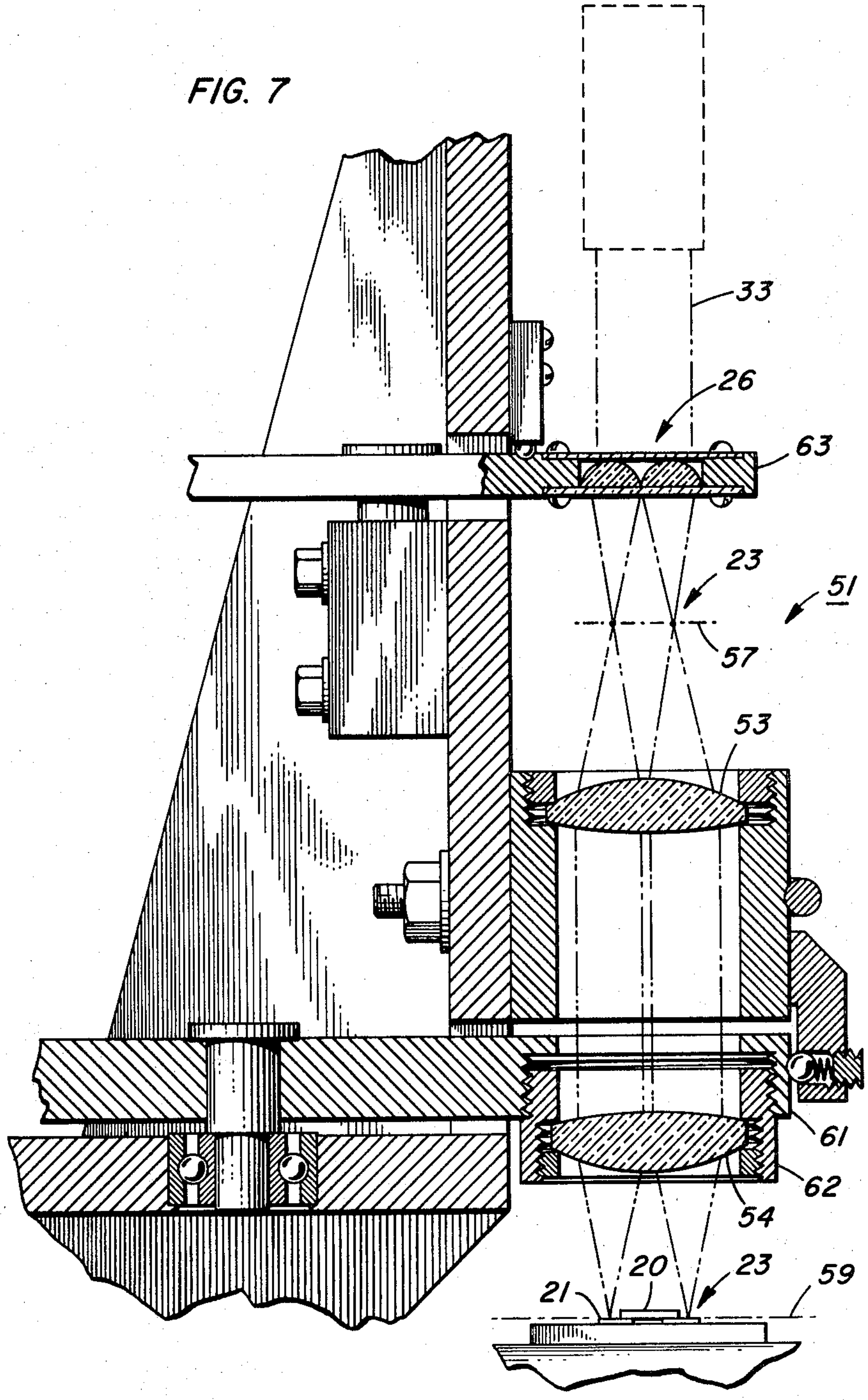

The optical system 51 illustrated in FIG. 5 is identical to the optical system illustrated in FIG. 6, except that FIG. 5 illustrates the effect of the optical system on parallel rays striking cylindrical lens 52 in a plane defined by a circular cross-section of the lens while FIG. 6 illustrates the effect of the optical system on parallel rays striking the cylindrical lens 52 in a plane perpendicular to a circular cross-section of the lens. Although for purposes of clarity the optical system 51 is illustrated with the cylindrical lens 52, the optical system is readily employed with a composite cylindrical lens as shown in FIG. 7.

The optical system 51 employs lenses 53 and 54 which are optically aligned with their focal planes coincident at plane 56. The cylindrical lens 52 is also optically aligned with lenses 53 and 54 and has its focal plane coincident with a focal plane of lens 53 at plane 57. "Optically aligned," as employed herein, refers to the alignment of an optical element such as a lens with its optical axis coincident with the optical axis of an optical system. As will be appreciated, by one skilled in the art, the optical axis of an optical system is not necessarily a straight line, but may be deflected by one or more reflections and/or refractions.

The cylindrical lens 52 focuses the collimate beam 33 to a line 58 in the focal plane 57 of lens 52. As shown in FIG. 4, deflection of beam 33 occurs in planes defining a circular cross-section of lens 52 whereas, as shown in FIG. 5, no deflection occurs in planes perpendicular to a circular cross-section of lens 52. Lens 53 acts as a collimating lens for the deflected portion of beam 33 (FIG. 5) and acts as a focusing lens for the undeflected portion of the beam (FIG. 6). This in effect rotates the line 58 formed in plane 57 by 90 degrees in plane 56. Lens 54 acts as a focusing lens for the portion of beam 33 collimated by lens 53 (FIG. 5) and acts as a collimating lens for that portion of beam 33 focused by lens 53 (FIG. 6). This in effect rotates the line 58 formed in plate 57 by 90 degrees in focal plane 59 of lens 54. In this manner, an image formed by cylindrical lens 52 or for that matter composite cylindrical lens 26, see FIG. 7, is relayed by lenses 53 and 54 and reformed in focal plane 59 of lens 54.

As will be most clearly seen from FIG. 6, the length of the line 58 formed by cylindrical lens 52 may be adjusted by the optical system 51. If the focal length of lens 53 is greater than the focal length of lens 54, the length of line 58 is reduced by an amount directly proportional to the ratio of the focal lengths, and, if the focal length of lens 53 is less than the focal length of lens 54, the length of line 58 is increased by an amount directly proportional to the ratio of the focal lengths. For example, if lens 53 has a focal length of 100 millimeters and lens 54 has a focal length of 25 millimeters, the length of line 58 is reduced to ¼ its original size. In this manner, the size of an image formed by a cylindrical lens or a composite cylindrical lens may be adjusted to any desired size.

Alternately, the cylindrical lens segments may be mounted for displacement relative to each other (not shown) to permit the perimeter pattern 23 to be size adjusted without employing the optical system 51. For example, the pattern 23 formed by lines 24—24 as illustrated in FIGS. 1 and 2 may be enlarged by displacing opposing cylindrical lens segments away from each other. As will be appreciated, the lines 24—24 will not meet when the lens segments 31—31 are displaced away from each other, but in many applications this is not essential. As will be appreciated, as long as the lines 24—24 strike each lead to be bonded it is immaterial whether they form a continuous line or not. However, if the lens segments 31—31 are not directly against each other, unfocused radiant energy will pass between the lens segments. If such unfocused radiant energy is deleterious to the workpiece, it may be masked in any suitable manner as, for example, by placing a reflective foil over the gap between the segments. It should be noted that the size as well as the configuration of the pattern may be changed in this manner.

Referring now to FIG. 7, the size of the pattern 23 formed by composite cylindrical lens 26 in plane 57 may be readily size adjusted by substituting a lens for lens 54 which has a different focal length. This may be accomplished by mounting a plurality of lenses in a rotating lens mount 61 to permit a substitute lens to be rotated into optical alignment with lens 53. The lenses may be mounted in lens barrels 62 to position the lenses the proper distance relative to lens 53 to maintain the focal planes of the substituted lenses coincident with the focal plane of lens 53. In a like manner, a plurality of composite cylindrical lenses for shaping beam 33 into different patterns may be mounted in a rotatable lens mount 63. This permits the ready selection of a desired pattern by rotating the proper composite cylindrical lens into alignment with the optical system 51 and also permits the pattern to be adjusted to the desired size by rotating the proper lens into alignment with the optical system.

In some situations it may be desirable to apply radiant energy only to the leads 21—21 and not to apply radiant energy to the areas lying between the leads. This may be readily accomplished by inserting a suitable mask (not shown) intermediate beam 33 and composite lens 26 to prohibit radiant energy which would otherwise be focused to that portion of the perimeter pattern 23 falling between the leads 21—21 from reaching lens 26. The mask (not shown), for example, may consist of a plurality of opaque or reflective strips (not shown) on a transparent support (not shown) or may consist simply of a screen or webbing. This results in a perimeter pattern where the line or lines forming the pattern is dashed or broken.

As will be appreciated, it is necessary to align a workpiece, such as workpiece 20, with the pattern 23 to properly apply the pattern about the workpiece 20. This is advantageously accomplished by employing a closed circuit television viewing system for remotely viewing the workpiece without danger to an operator from radiant energy applied to the workpiece.

Figures 8, 9, 10:
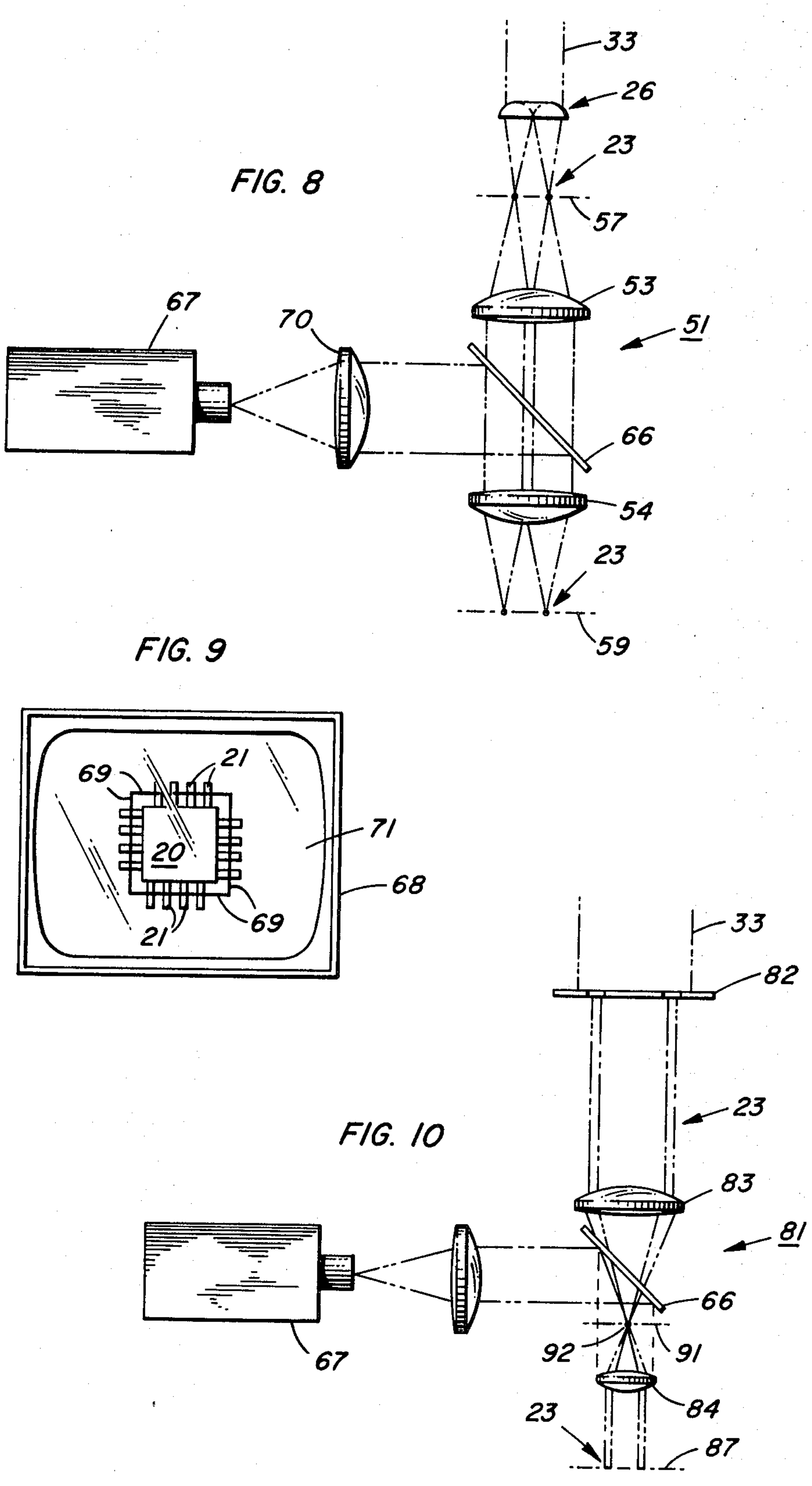
FIGS. 8–9 illustrate a closed circuit television viewing system suitable for use with the optical system of FIGS. 5–7 for continuously viewing a workpiece.
FIG. 10 illustrates an alternate optical system for shaping a beam of radiant energy into a predetermined pattern.

Referring now to FIG. 8, a dichroic mirror 66 is advantageously employed between lenses 53 and 54 to reflect an image of the workpiece 20 to a television camera 67. For example, when collimated beam 33 is generated by a laser, the beam 33 is highly monochromatic, i.e., consists of essentially a single wavelength. By employing a dichroic mirror 66 which freely passes the wavelength of beam 33, but which reflects all other wavelengths, an image of the workpiece from natural or artificial illumination is reflected by the dichroic mirror 66 to the television camera 67 without interfering with the beam 33. A lens 70 is advantageously employed to focus the image of the workpiece on the image plane of the television camera 67. The television camera relays the image in a conventional manner to a television monitor 68 (FIG. 9) for continuous remote viewing of the workpiece with complete operator safety. Reference lines 69—69 having the same configuration as the pattern 23 formed by composite cylindrical lens 26 may be advantageously utilized on screen 71 of television monitor 68 to facilitate alignment of the workpiece 20 with the pattern. The lines 69—69, for example, may be formed directly on screen 71 in any suitable manner or may be formed by inserting a reticle (not shown) in the optical system 51 to superimpose lines 69—69 over the workpiece. By bringing the workpiece into the desired alignment with lines 69—69, the workpiece is automatically brought into proper alignment with the pattern.

A suitable method for positioning workpiece 20 relative to a workpiece 72 to align leads 21—21 with their associated bonding sites such as contact areas 73—73 (FIG. 1) and for positioning the aligned workpiece relative to a beam of radiant energy without disturbing the alignment of the workpieces relative to each other is disclosed and claimed in copending application Ser. No. 633,854, filed Apr. 26, 1967, and assigned to Western Electric Company, Inc.

Referring now to FIG. 10, an alternate optical system 8 suitable for shaping a collimated beam 33 into perimeter pattern 23 may advantageously employ a mask 82 for shaping the beam 33 into the desired pattern and lenses 83 and 84 for relaying the pattern to a plane 87, for example, of a workpiece. The lenses 83 and 84 are positioned with their focal planes coincident at plane 91 so that the pattern 23 is focused to the focal point 92 of lens 83 and collimated by lens 84 to reform the pattern. The lenses 83 and 84 adjust the size of the pattern formed by mask 82 directly proportional to the ratio of the focal lengths of the lenses in the same manner discussed above with reference to optical system 51. Dichroic mirror 66 and camera 67 may be employed to permit continuous viewing of the workpiece without operator danger in the same manner discussed above with reference to FIG. 8.

As will be appreciated, the mask 76 may be any opaque or reflective material which is apertured to form a desired pattern. For example, a highly reflective film (not shown) such as gold or silver may be deposited on a glass plate (not shown) and a desired pattern etched in the reflective film. In this manner, the reflective film will reflect or mask unwanted portions of the beam while the desired pattern is transmitted through the glass plate. By providing a plurality of masks for shaping beam 33 into different patterns and by providing a plurality of lenses such as lens 82 having different focal lengths, a desired pattern may be formed and then adjusted to the desired size.

The optical system 81 has the advantage of permitting intricate patterns to be formed with very little difficulty. However, as the mask 82 in shaping beam 33 does not forcus or concentrate the beam but rather eliminates large portions of the beam to form the desired pattern, the use of optical system 81 is restricted to those applications where either a high energy level is not required or a sufficiently high energy source is available. In addition, as the beam has essentially the same energy density when it passes through lens 84 as it does at the workpiece, the lens 84 must be resistant to damage by the beam.

THE METHOD

The method of this invention includes the steps of (1) generating a beam of radiant energy, (2) shaping the beam into a desired pattern, and (3) applying the pattern to preselected areas.

The beam of radiant energy may be generated in any suitable manner. For example, a laser may be employed to generate a beam of radiant energy highly suitable for bonding applications. However, alternate beam generating sources such as infrared, ultraviolet, incandescent, arc or plasma sources of radiant energy may be employed if suitable for the particular application.

The beam of radiant energy is shaped into a line or lines defining a desired pattern. A cylindrical lens, composite cylindrical lens, or mask may be advantageously employed as discussed above to shape a beam of radiant energy into the desired pattern.

In simultaneously bonding multiple leads extending from a workpiece such as a beam lead-like device, the beam of radiant energy is advantageously shaped into a perimeter pattern to permit application of the pattern to each lead to be bonded without direct application to the workpiece itself, for example, as shown in FIG. 1. In any simultaneous multiple lead bonding application, the beam of radiant energy is advantageously shaped into a pattern which permits application of radiant energy to each lead to be bonded. For example, in bonding external leads about the perimeter of an integrated circuit, a perimeter pattern which generally follows the perimeter of the circuit to simultaneously bond each lead may be advantageously employed.

A shaped pattern may also be advantageously employed in other applications such as heat sealing one or more workpieces in a desired pattern, or cutting or shaping a workpiece in a desired pattern. For example, in some situations it may be desirable to encapsulate a device by heat sealing an encapsulating material about the perimeter of the device by applying a perimeter pattern of radiant energy about the perimeter of the device. Or, it may be desirable to isolate one or more circuit components by applying a perimeter pattern of radiant energy about the perimeter of the components to cut or shape the area about the components to isolate the components.

A shaped pattern of radiant energy has application whenever it is desired to apply radiant energy to preselected areas and/or to avoid applying radiant energy to other areas.

The pattern of radiant energy may be applied to preselected areas by positioning a workpiece relative to the optical axis of a beam shaping optical system as illustrated in FIGS. 1, 7, 8, 9 and 10. With the workpiece properly positioned, the pattern of radiant energy is applied to the preselected areas by generating a beam of radiant energy and shaping the beam to form the desired pattern.

The method of this invention may also include the step of size adjusting the pattern. In many applications it may be desirable to adjust the size of the pattern as shown, for example, in FIGS. 5 and 6 to facilitate the application of the pattern to a desired area. For example, in bonding a plurality of beam lead-like devices to a thin-film circuit where different devices have different dimensions, it may be highly desirable to adjust the size of the pattern so that each of the devices may be bonded.

This may be accomplished by providing a plurality of composite lenses or masks as discussed above with reference to FIGS. 7 and 10 so that the pattern having the required configuration and size for each application can be provided. Or, an optical system such as optical system 51 (FIGS. 5–7) or 81 (FIG. 10) discussed above may be employed to adjust the size of the pattern without changing the composite lens or mask. Also, as discussed above, the segments forming the composite lens may be mounted for relative displacement to permit size adjustment of the pattern.

It is to be understood that this invention has general application whenever a pattern of radiant energy having a desired configuration may be advantageously employed and is not restricted to simultaneous lead bonding. In addition, many variations and modifications will suggest themselves to one skilled in the art without departing from the spirit of the invention.

What is claimed is:

1. A method for simultaneously bonding a plurality of leads extending from a first workpiece wherein the first workpiece is positioned relative to a second workpiece so that each lead to be bonded is aligned with a bonding site on the second workpiece, comprising the steps of:
- generating a beam of radiant energy,
- shaping the beam of radiant energy into a perimeter pattern, and
- applying the pattern simultaneously to the leads to be bonded to bond each lead to its associated bonding site.

2. A method for simultaneously bonding a plurality of leads extending from at least two sides of a workpiece wherein the workpiece has a generally polygonal configuration, the method comprising the steps of:
- generating a beam of radiant energy, and
- shaping the beam of radiant energy to form a line generally parallel to each side of the workpiece from which a lead extends and spaced from each such side a predetermined distance to simultaneously apply radiant energy to the leads so as to bond the leads without applying radiant energy directly to the workpiece.

3. A method for simultaneously bonding a plurality of leads extending from at least one side of a beam lead-like device wherein each lead to be bonded is aligned with an associated bonding site on a workpiece, the method comprising:
- generating a collimated beam of radiant energy,
- shaping the beam of radiant energy to form a polygonal perimeter pattern having substantially the same configuration as the beam lead-like device,
- size adjusting the perimeter pattern to be slightly larger than the perimeter of the beam lead-like device, and
- applying the pattern directly to the leads extending from the device to bond the leads to their associated bonding sites without applying radiant energy directly to the beam lead-like device.

4. A method for simultaneously bonding a plurality of leads extending from a first, generally rectangular, workpiece wherein the first workpicce is positioned relative to a second workpiece so that each lead is aligned with a bonding site on the second workpiece, said bonding sites being arranged in a generally rectangular configuration, the method comprising the steps of:
- generating a beam of radiant energy, and
- shaping the beam of radiant energy to simultaneously apply radiant energy to each of the leads to be bonded to bond the leads to the bonding sites.

5. A method for simultaneously bonding a plurality of leads extending from a first, generally rectangular, workpiece wherein the first workpiece is positioned relative to a second workpiece so that each lead is aligned with a bonding site on the second workpiece, said bonding sites being arranged in a generally rectangular configuration, the method comprising the steps of:
- generating a beam of radiant energy;
- shaping the beam of radiant energy into two pairs of generally parallel lines, which pairs intersect at generally right angles; and
- applying the shaped beam of radiant energy simultaneously to the leads extending from the first workpiece to bond the leads to the generally rectangular array of bonding sites without applying radiant energy directly to the first workpiece.

6. The method of claim 5 wherein the step of shaping the beam of radiant energy includes:
- passing the radiant energy through four cylindrical lens segments, the segments being positioned relative to each other to form a composite cylinder lens wherein a line formed by each cylindrical lens segment, when the beam of radiant energy strikes the composite cylindrical lens, forms a side of the perimeter of a four-sided polygon.

References Cited

UNITED STATES PATENTS

| | | | |
|---|---|---|---|
| 3,304,403 | 2/1967 | Harper | 219—121 |
| 3,374,531 | 3/1968 | Brice | 29—625 XR |
| 3,402,460 | 9/1968 | Smith | 29—589 |

OTHER REFERENCES

Welding Journal, December 1965 by Anderson et al., p.p. 1010-1026.

IBM Technical Disclosure Bulletin by Kremen, Nov. 6, 1965, p. 882.

Welding Research Supplement by Pfluger et al., June 1965 pp. 264s–269s.

Electronics: July 5, 1963 by Thomas Maguire, pp. 23–25.

JOHN F. CAMPBELL, Primary Examiner

R. B. LAZARUS, Assistant Examiner

U.S. Cl. X.R.

219—121; 29—584, 589